United States Patent
Smeys et al.

(10) Patent No.: US 7,584,533 B2
(45) Date of Patent: Sep. 8, 2009

(54) METHOD OF FABRICATING AN INDUCTOR STRUCTURE ON AN INTEGRATED CIRCUIT STRUCTURE

(75) Inventors: Peter Smeys, Mountain View, CA (US); Peter Johnson, Sunnyvale, CA (US); Andrei Papou, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/973,861

(22) Filed: Oct. 10, 2007

(65) Prior Publication Data

US 2009/0094818 A1    Apr. 16, 2009

(51) Int. Cl.
*H01F 3/00* (2006.01)
*H01F 41/02* (2006.01)

(52) U.S. Cl. .................... 29/604; 29/602.1; 29/605; 29/606; 29/840; 228/175; 228/180.22; 228/219; 336/110; 336/175; 336/178; 336/184; 336/214; 363/17; 363/48; 363/58

(58) Field of Classification Search ............... 29/602.1, 29/604–607, 840; 336/110, 175, 178, 184, 336/214, 215, 234; 363/17, 48, 58; 228/175, 228/180.22, 219
See application file for complete search history.

(56) References Cited

U.S. PATENT DOCUMENTS

| | | | | |
|---|---|---|---|---|
| 6,233,834 | B1 * | 5/2001 | Walsh | ................ 33/1 PT |
| 6,990,725 | B2 * | 1/2006 | Fontanella et al. | ......... 29/602.1 |

OTHER PUBLICATIONS

U.S. Appl. No. 11/713,912, filed Mar. 5, 2007, Peter J. Hopper et al.
U.S. Appl. No. 11/495,143, filed Jul. 27, 2006, Peter J. Hopper et al.
U.S. Appl. No. 11/504,972, filed Aug. 15, 2006, Peter J. Hopper et al.

* cited by examiner

*Primary Examiner*—Paul D Kim
(74) *Attorney, Agent, or Firm*—Dergosits & Noah LLP

(57) ABSTRACT

A damascene process is utilized to fabricate the segmented magnetic core elements of an integrated circuit inductor structure. The magnetic core is electroplated from a seed layer that is conformal with a permanent dielectric mold that results in sidewall plating defining an easy magnetic axis. The hard axis runs parallel to the longitudinal axis of the core and the inductor coils are orthogonal to the core's longitudinal axis. The magnetic field generated by the inductor coils is, therefore, parallel and self-aligned to the hard magnetic axis. The easy axis can be enhanced by electroplating in an applied magnetic field parallel to the easy axis.

15 Claims, 5 Drawing Sheets

METHOD OF FABRICATING AN INDUCTOR STRUCTURE ON AN INTEGRATED CIRCUIT STRUCTURE

FIELD OF THE INVENTION

The present invention relates to semiconductor integrated circuits and, in particular, to techniques for fabricating an on-chip inductor structure utilizing a damascene process sequence to provide a segmented magnetic core with a hard axis parallel to and self-aligned with the direction of the field produced by the magnetic coil.

DISCUSSION OF THE RELATED ART

Inductors are commonly used in the electronics industry for storing magnetic energy. An inductor is typically created by providing an electric current through a metal conductor, such as a metal plate or bar. The current passing through the metal conductor creates a magnetic field or flux around the conductor.

In the semiconductor industry, it is known to form inductors as part of integrated circuit structures. The inductors are typically created by fabricating what is commonly called an "air coil" inductor around the integrated circuit chip. The air coil inductor is either aluminum or some other metal that is patterned in a helical, toroidal or "watch spring" coil shape. By applying a current through the inductor, the magnetic flux is created.

Inductors are used in integrated circuits for a variety of applications. Perhaps the most common application is in direct current to direct current (DC-DC) switching regulators. In many situations, however, a conventional on-chip inductor does not generate enough flux or energy for a particular application. In these cases, a larger off-chip inductor may be required.

There are a number of well recognized problems associated with the use of off-chip inductors. Foremost, they tend to be expensive. They can also be problematic in applications where space is at a premium, such as in hand-held devices like cell phones and personal digital assistants (PDA).

The issue of providing small, efficient on-chip power inductors, particularly for switching regulator applications, is receiving a great deal of attention in the integrated circuit industry. For example, co-pending and commonly-assigned U.S. patent application Ser. No. 11/713,921, filed on Mar. 5, 2007 by Peter J. Hopper et al., titled "On-Chip Power Inductor," discloses an on-chip inductor structure for a DC-DC power regulator circuit that utilizes segmented ferromagnetic metal plates and a copper spiral coil. The design merges the switching transistor metallization with the inductor. Thick top level conductor metal that is used to strap the transistor array and to lower on-state resistance is also used to extend the power inductor into the transistor array. Thus, the structure includes three basic components: a power inductor that spirals around the transistor array, the transistor array itself, and the transistor metallization that is used to form a distributed inductance over the transistor array.

Co-pending and commonly-assigned U.S. patent application Ser. No. 11/495,143, filed on Jul. 27, 2006, by Peter J. Hopper et al., titled "Apparatus and Method for Wafer Level Fabrication of High Value Inductors on Semiconductor Integrated Circuits," discloses techniques for wafer level fabrication of high value inductors directly on top of semiconductor integrated circuits. The techniques include fabricating a semiconductor wafer to include a plurality of circuit die, with each die including a power circuit and a switching node. After the power circuit wafer is fabricated, an inductor structure is fabricated directly onto each die. For each die, electrical connections are made between the switching node of the power circuit and the inductor. Each inductor is fabricated by forming a lower magnetic core on a dielectric layer formed over the power circuit wafer. An insulating layer is formed over the lower magnetic core, and then an inductor coil is formed over the lower magnetic core of each die. A layer of magnetic paste is also optionally provided over each inductor coil to further increase inductance.

Co-pending and commonly-assigned U.S. patent application Ser. No. 11/504,972, filed on Aug. 15, 2006, by Peter J. Hopper et al., titled "Apparatus and Method for Wafer Level fabrication of High Value Inductors on Semiconductor Integrated Circuits," also discloses techniques for wafer level fabrication of high value inductors directly on top of semiconductor integrated circuits. According to the technique disclosed in this application, a plated magnetic layer is formed over the inductors to raise the permeability and inductance of the structure.

In the inductor structures disclosed in application Ser. No. 11/495,143 and in application Ser. No. 11/504,972, in order to achieve magnetic saturation at higher applied fields, the magnetic core material is generated with a hard axis parallel to the magnetic field produced by the inductor coil. By so defining the hard axis, the inductor can operate at higher currents without saturating the core material. The segmented elements of the magnetic core surround the inductor coils. The NiFe magnetic core elements are electroplated "bottom up" from a seed layer covered with a resist mold mask.

Application Ser. No. 11/713,921, application Ser. No. 11/495,143 and application Ser. No. 11/504,972 are hereby incorporated by reference herein in their entirety to provide background information relating to the present invention.

SUMMARY OF THE INVENTION

In accordance with the present invention, a permanent dielectric mold is created prior to seed layer deposition utilizing a damascene process sequence. Since the seed layer is formed not only on the bottom of the mold but also on it sidewalls, the ferromagnetic core elements are plated from the sides as well as from the bottom of the mold. In this configuration, the shape anisotropy driven by the side wall deposition enhances easy axis formation orthogonal to the sidewalls. As a result, the hard axis is parallel to the length of the magnetic element and self-aligned with the direction of the magnetic field produced by the inductor coil. The inductor structure may be further improved by plating in an external magnetic field. If the inductor is configured as a long rectangle with the external field in the plane of the wafer parallel to the long axis of the inductor, then the hard axis is enhanced and the inductor performance is improved.

The damascene process sequence of the present invention results in a segmented magnetic structure that is smaller than that produced by the conventional "bottom up" technique. The damascene based structure is smaller eddy current losses and, in contrast to the "bottom up" structures, has an easy axis in the plane of the wafer. In addition, the damascene approach provides a fully planarized process.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

Figure 1:
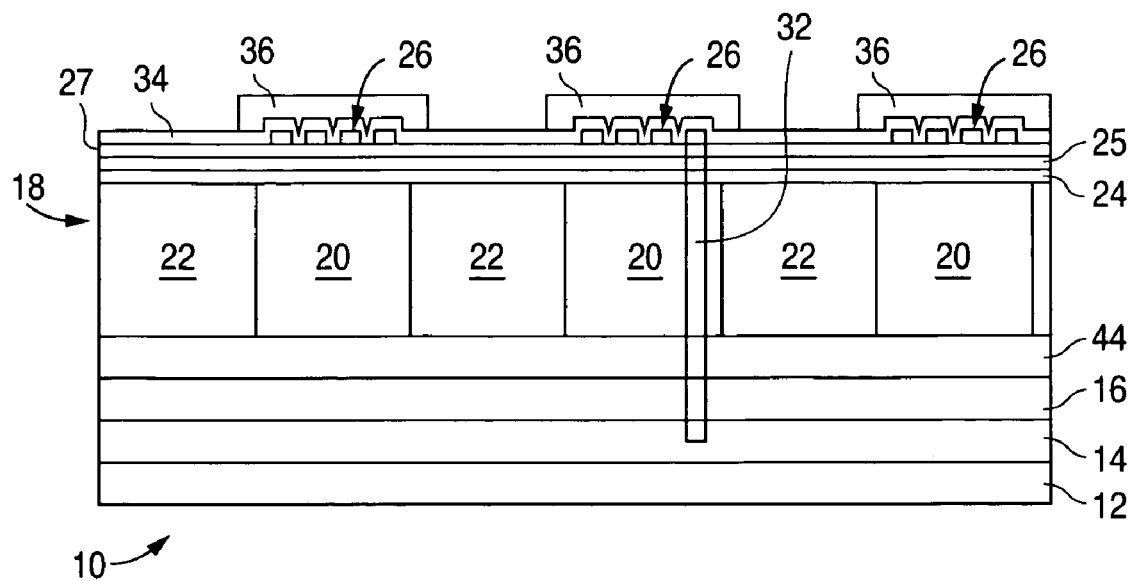
FIG. 1 is a partial cross section drawing illustrating a semiconductor integrated circuit die with both power circuitry and an inductor structure fabricated thereon.

FIG. 1 shows a cross section of a semiconductor integrated circuit die 10 with power circuitry and an inductor fabricated directly thereon. The die 10 includes a silicon substrate 12 with the power circuitry fabricated thereon in accordance with well known semiconductor manufacturing techniques (for the sake of simplicity, the power circuitry is not shown in FIG. 1). The die 10 also has metal interconnect layer(s) 14, including one or more levels of metal interconnect, and an upper dielectric layer 16 (e.g., a die passivation layer) formed over the metal interconnect layers 14. An inductor structure 18 is fabricated directly on a plating layer 44 that is formed over the interconnect dielectric layer 16. The inductor 18 includes a plurality of magnetic core inductor members 20 provided between spacers 22, a planarization surface 24 formed over the inductor members 20 and spacers 22, an insulating layer 25, another plating layer 27, an inductor coil 26, a protective layer 34 formed over the coil 26, and a segmented plated magnetic layer 36 formed over the protective layer 34. An electrical contact 32 is provided between the coil 26 and a switching node (not shown) provided on one of the metal layers of interconnect structure 14.

Figure 2:
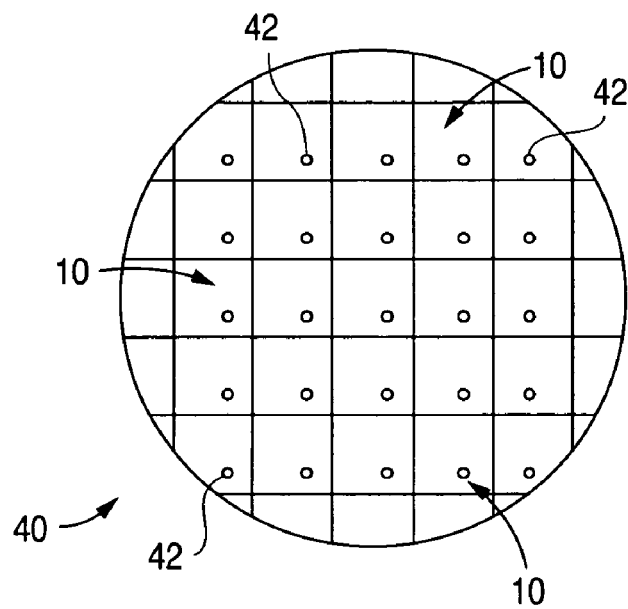
FIG. 2 is a top view illustrating a semiconductor wafer that includes a plurality of integrated circuit die with each die having power circuitry fabricated thereon.

FIG. 2 shows a semiconductor wafer 40 that includes a plurality of individual integrated circuit die 10. Each die 10 includes power regulation circuitry fabricated thereon, including a switching node 42. For the sake of simplicity, the power regulation circuitry is not shown in FIG. 2. The switching node 42 is typically in metal contact of one of the metal interconnect layers 14. The switching node 42 is also in electrical contact with the underlying transistors that form the power regulation circuitry on the die 10.

Figure 3A:
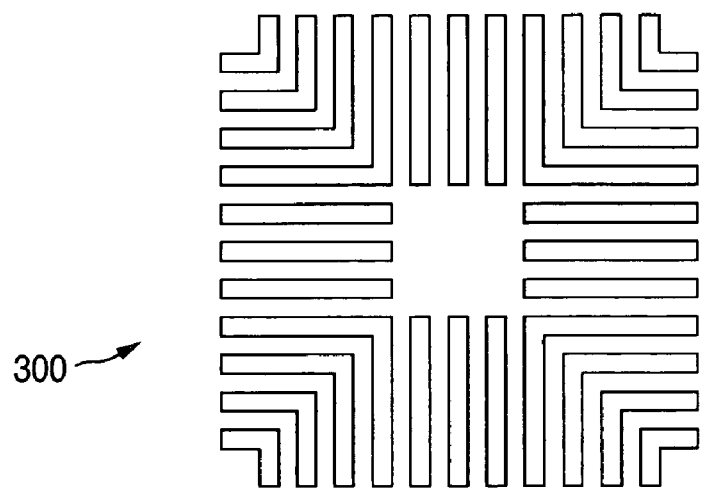
FIGS. 3A-3C are top views illustrating the top segmented magnetic plate, the conductive inductor coil and the bottom segmented magnetic plate, respectively, of an inductor structure fabricated in accordance with the concepts of the present invention.
Figure 3B:
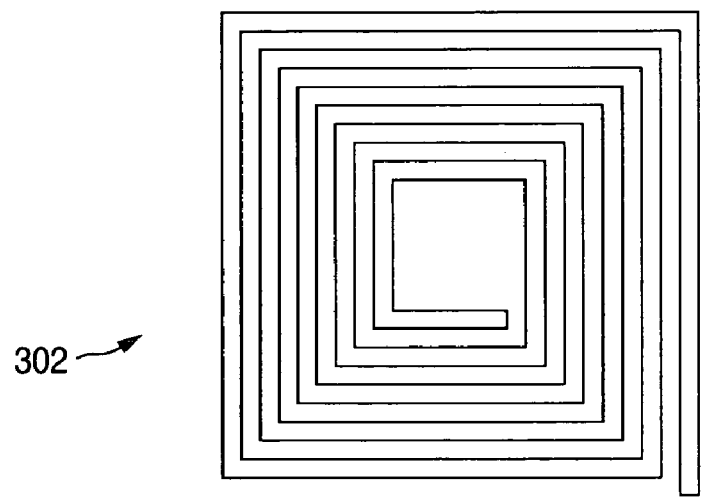
Figure 3C:
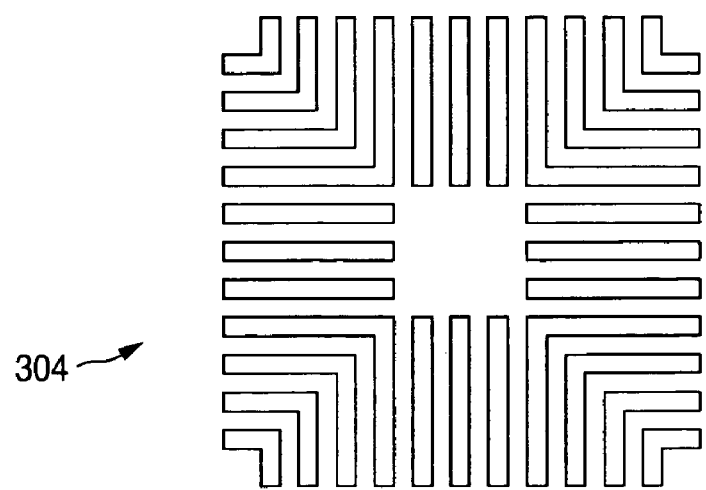

The on-chip inductor structure 18 includes two magnetic core layers that surround a copper inductor coil. FIG. 3A shows an embodiment of a bottom segmented magnetic core layer 300; FIG. 3B shows an embodiment of a copper coil 302; and FIG. 3C shows an embodiment of a top segmented magnetic core layer 304. Those skilled in the art will appreciate that the embodiments shown in FIGS. 3A-3C are examples and that other embodiments of the bottom segmented magnetic core, the inductor coil and the top segmented magnetic core may be utilized. For example, FIGS. 3A and 3C show the bottom segmented magnetic core 300 and the top segmented magnetic core 304 to be identical; those skilled in the art will appreciate that this need not necessarily be the case.

Figure 4A:
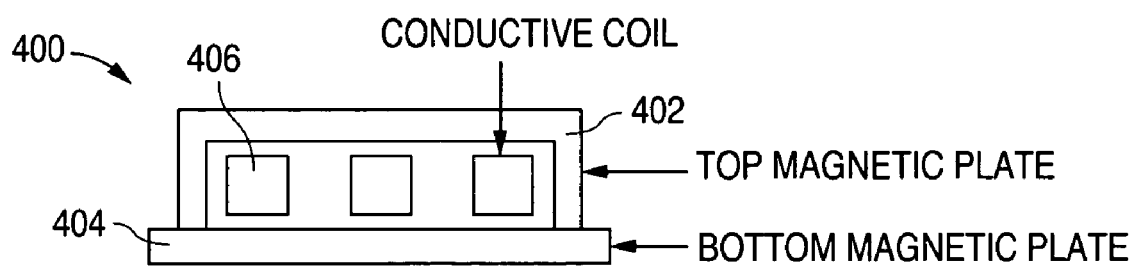
FIGS. 4A and 4B are cross section views illustrating two respective embodiments of an inductor structure fabricated in accordance with the concepts of the present invention.
Figure 4B:
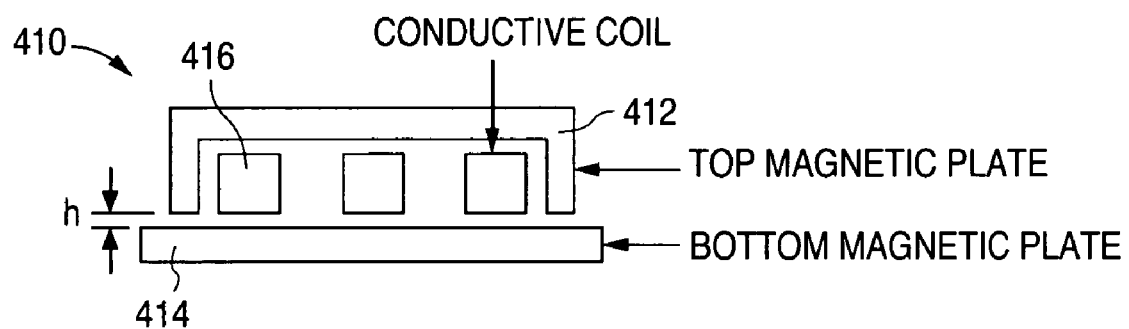

FIGS. 4A and 4B show cross section views of two inductor structures 400 and 410, respectively, that are compatible with the concepts of the present invention. In the FIG. 4A structure 400, the patterned top magnetic plate 402 and the patterned bottom magnetic plate 404 surround the conductive inductor coil 406 and touch each other; large inductance can be made by this configuration because reluctance is minimized. In the FIG. 4B inductor structure 410, there is a finite gap (h) between the top patterned magnetic plate 412 and the patterned bottom magnetic plate 414 that surround the conductive coil 416. The magnetic path in this case is composed of the magnetic layers 412, 414 and the gap h. The total inductance can be adjusted by changing the height h of the gap. Also, magnetic saturation due to high current level can be controlled by the gap height h.

As discussed in greater detail below in conjunction with FIGS. 5A and 5B, in order to create a dense pattern of closely packed small segmented magnetic core elements, the present invention utilizes a damascene process sequence to fabricate the lower core magnetic core layer 300 and the top magnetic core layer 304 of the inductor structure 18.

Figure 5A:
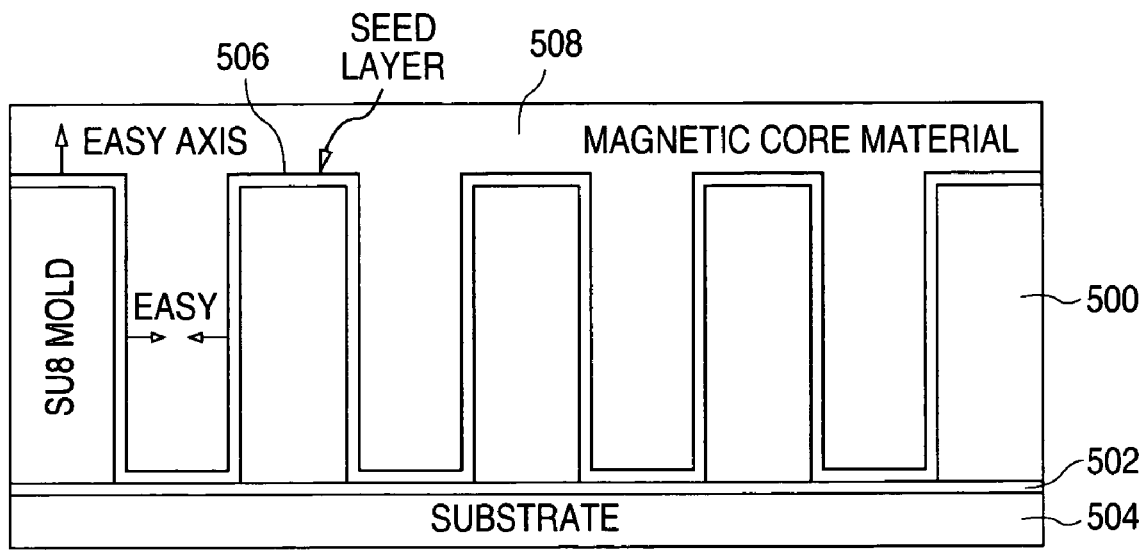
FIGS. 5A and 5B are partial cross section drawings illustrating a damascene process sequence for fabricating inductor structures in accordance with the concepts of the present invention.
Figure 5B:
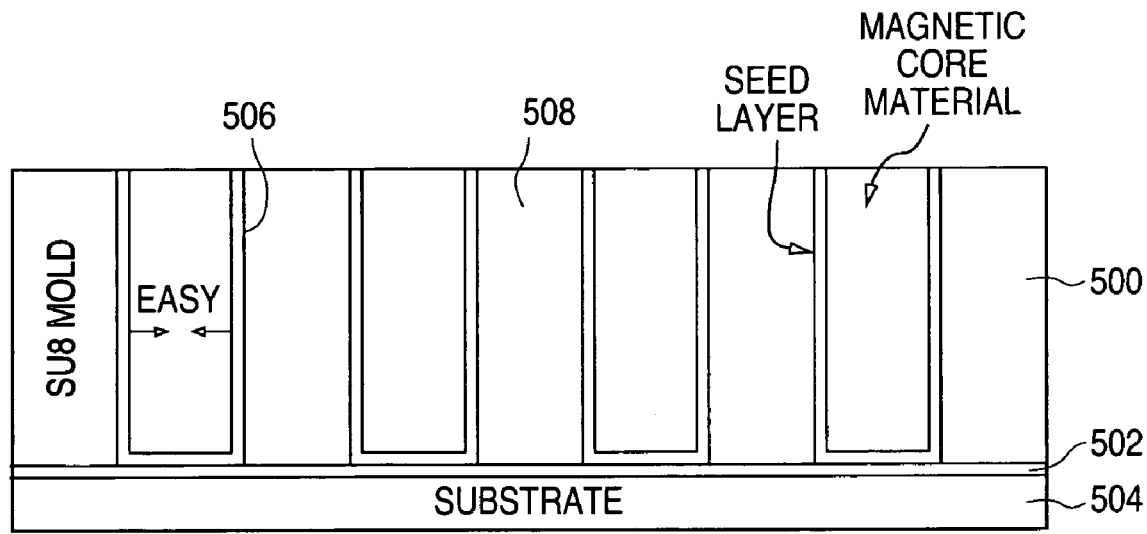

Referring to FIG. 5A, the lower magnetic core layer is electroplated in a permanent mold 500 that is created by patterning SU8, a well known negative photo image epoxy. The SU8 material is deposited directly on top of the passivation nitride plating layer 502 (numeral 44 in FIG. 1 above) that is formed over the underlying integrated circuit substrate 504; it is well know that silicon nitride is a commonly utilized final passivation layer for many integrated circuit structures. After the epoxy mold 500 is patterned and cured using well known photolithographic techniques, a seed layer 506 for electroplating is deposited by physical vapor deposition. In this embodiment of the invention, the features of the patterned SU8 mold 500 are about 25-35 µm high and less than 10 µm wide; the space between the SU8 mold features is less than 10 µm. A typical seed layer 506 is a stack of Ti+Al or Ti+NiFe. The selection of an appropriate seed layer material is essential to ensuring the proper crystal orientation and magnetic anisotropy of the subsequently electroplated magnetic film. With the seed layer in place, a ferromagnetic layer 508, such as, for example, permalloy (80% Ni+20% Fe), or an alternative magnetic core material is electroplated in accordance with well known techniques.

The electroplated magnetic material 508 needs to be about 5 µm thick in order to fill the gap between the features of the SU8 epoxy mold 500. As shown in FIG. 5A, the easy axis of the magnetic film 508 will be in the direction of film growth and normal to the surfaces of the SU8 epoxy mold 500. As discussed below, the easy axis can be enhanced by carrying out the electroplating process in an applied magnetic field parallel to the shape anisotropy induced easy axis.

Following the electroplating step, a chemical mechanical polishing (CMP) process removes the excess magnetic core material 508 above the SU8 mold 500. The CMP step, which will be highly chemical, stops on the upper surface of SU8 mold features with minimal loss. The resulting structure is shown in FIG. 5B.

Figure 6:
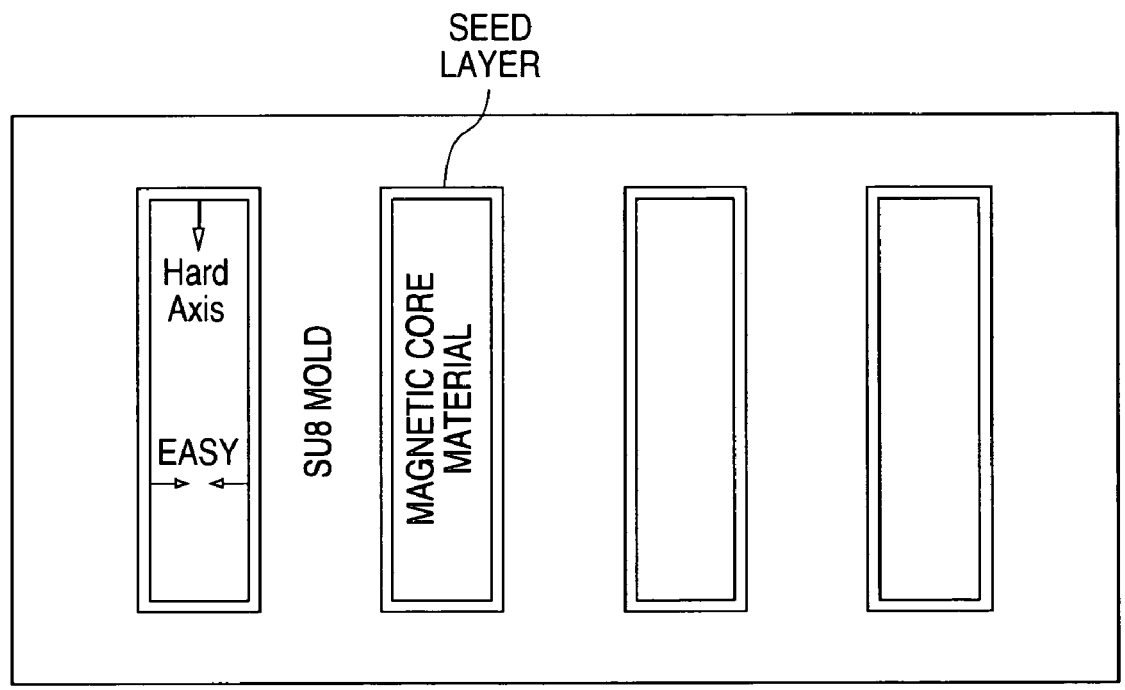
FIG. 6 is a top planar view illustrating magnetic core elements fabricated in accordance with a damascene process sequence in accordance with the concepts of the present invention.

FIG. 6 shows a top planar view of the magnetic core elements 508 after CMP. The magnetic core elements 508 can be several hundred microns long. As produced, the hard axis of the core elements 508 runs parallel to their length, as shown in FIG. 6.

After coating the lower magnetic core elements 508 with a thin dielectric layer (e.g. 1-3 μm SU8) that both defines the magnetic gap with the top magnetic core, as discussed above in conjunction with FIG. 4B, and provides electrical insulation, the copper coils of the inductor structure are patterned. As shown in FIGS. 3A-3C, these coils are orthogonal to the long axis of the magnetic core elements. The magnetic field generated by the copper inductor coils is, therefore, parallel and self-aligned to the hard magnetic axis. In this case, the electroplated copper coil is about 50 μm thick.

Finally, after electrically insulating the copper inductor coils, the top magnetic core elements are fabricated in a manner similar to the approach discussed above for fabricating the bottom core layer. That is, a patterned dielectric mold (e.g. SU8 epoxy) is formed for the top magnetic core layer, a seed layer (e.g., Ti+Al or Ti+NiFe) is formed on the exposed surfaces of the mold, and a ferromagnetic layer (e.g. permalloy) is electroplated and chemically mechanically polished to define the segmented top core plate. Again, the hard axis of the planar portion of the top core elements is parallel and self-aligned to the magnetic field produced by the inductor coils.

Power inductors configured as noted above can operate at higher currents than previously experienced without saturating the magnetic core.

Figure 7:
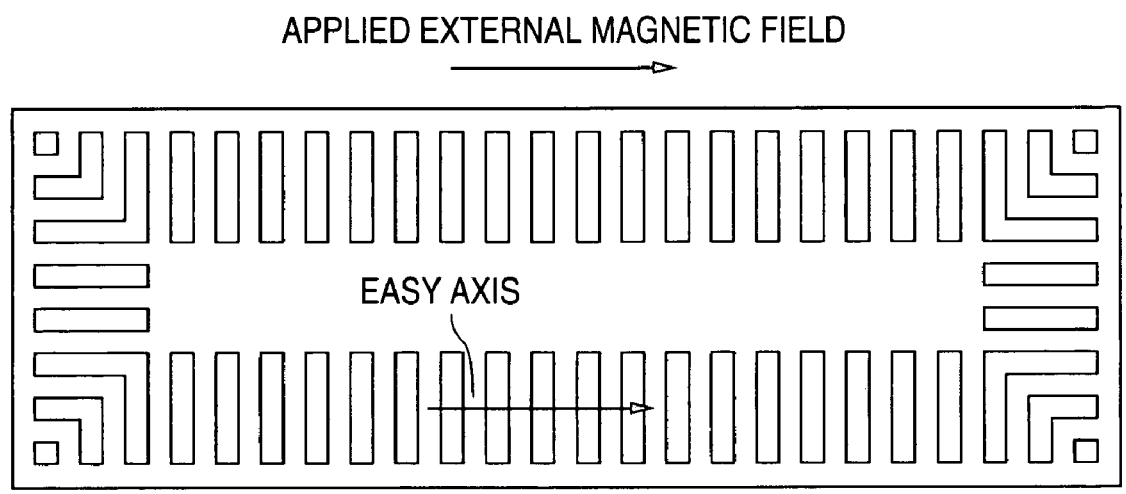
FIG. 7 is a top view illustrating a magnetic core configuration for an inductor plated in an external magnetic field in accordance with the concepts of the present invention.

As mentioned above, the performance of these power inductors can be further improved if the core material is plated in an external magnetic field that is applied parallel to the easy axis. Since this external field can only be applied in one direction, the shape of the inductors must be appropriately adjusted. A long rectangular inductor is preferable. Most of the core elements will have their hard axis parallel to the magnetic field produced by the associated copper inductor coil, as shown in FIG. 7. There are commercially available electroplating tools that can be configured to have an external field in the plane of the IC wafer. The FIG. 7 inductor configuration is compatible with these tools.

Of course, if the magnetic field is applied normal to the IC wafer during electroplating, then a square inductor shape of the type shown in FIG. 3B could be maintained. In this case, the easy axis would be normal to the wafer and the hard axis would always be parallel to the magnetic field produced by the inductor coil. Unfortunately, commercially available electroplating tools are not currently configured with the external field normal to the wafer.

It should be understood that the particular embodiments of the invention described above have been provided by way of example and that other modifications may occur to those skilled in the art without departing from the scope and spirit of the invention as express in the appended claims and their equivalents.

What is claimed is:

1. A method of fabricating an inductor structure on an integrated circuit structure, the method comprising:
   forming a passivation layer over the integrated circuit structure;
   forming a segmented, bottom magnetic core element over the passivation layer, the bottom magnetic core element having a longitudinal axis;
   forming a conductive inductor coil element over the bottom magnetic core element and separated therefrom by intervening dielectric material;
   forming a segmented, top magnetic core element over the inductor coil element and separated therefrom by intervening dielectric material, the top magnetic core element having a longitudinal axis that is parallel to the longitudinal axis of the bottom magnetic core element; and
   wherein the inductor coil element is formed to be orthogonal to the longitudinal axis of the bottom and top magnetic core elements, an easy axis of the bottom and top magnetic core elements is parallel to the inductor coil element, and a hard axis of the bottom and top magnetic core elements is parallel to the longitudinal axis of the bottom and top magnetic core elements.

2. The method as in claim 1, and wherein the bottom magnetic core element is separated from top magnetic core element by a gap having a preselected gap height.

3. The method as in claim 1, and wherein the bottom magnetic core element comprises a ferromagnetic material.

4. The method as in claim 3, and wherein the ferromagnetic material comprises permalloy.

5. The method as in claim 1, and wherein the top magnetic core element comprises a ferromagnetic material.

6. The method as in claim 5, and wherein the ferromagnetic material comprises permalloy.

7. The method as in claim 1, and wherein the inductor coil element comprises copper.

8. The method as in claim 1, and wherein the integrated circuit structure includes at least one integrated circuit and the inductor structure is electrically connected to the at least one integrated circuit.

9. A method of fabricating an inductor structure over a substrate, the method comprising:
   forming a passivation layer over the substrate;
   forming a dielectric bottom element mold on the passivation layer, the bottom element mold including a plurality of raised portions that define a plurality of spaced-apart bottom element trenches, each bottom element trench having a bottom surface and sidewall surfaces and a longitudinal axis;
   forming a conductive bottom seed layer on exposed surfaces of the bottom element mold, including on the bottom and sidewall surfaces of each bottom element trench;
   utilizing the bottom seed layer to electroplate ferromagnetic material outward from the sidewall surfaces of the bottom element trenches to fill the bottom element trenches and such that an easy axis of the ferromagnetic material filling each bottom element trench is orthogonal to the longitudinal axis of said bottom element trench and a hard axis of the ferromagnetic material filling each bottom element trench is parallel to the longitudinal axis of said bottom element trench;
   planarizing a top surface of the ferromagnetic material filling each bottom element trench with a top surface of the bottom element mold;
   forming a first layer of dielectric material over the top surface of the planarized ferromagnetic material in each bottom element trench and over the top surface of the bottom layer mold;
   forming a conductive inductor coil over the first layer of dielectric material such that the conductive coil runs orthogonal to the longitudinal axis of the bottom element trenches;
   forming a second layer of dielectric material to electrically insulate the conductive inductor coil;

forming a dielectric top element mold on the second layer of dielectric material, the top element mold having a plurality of raised portions that define a plurality of spaced-apart top element trenches, each top element trench having a bottom surface and sidewall surfaces and a longitudinal axis;

forming a conductive top seed layer on exposed surfaces of the top layer mold, including on the bottom and sidewall surfaces of each top element trench; and utilizing the top seed layer to electroplate ferromagnetic material outward from the sidewall surfaces of the top element trenches to fill the top element trenches and such that the easy axis of the ferromagnetic material filling each top element trench is orthogonal to the longitudinal axis of said top element trench and the hard axis of the ferromagnetic material filling each top element trench is parallel to the longitudinal axis of said top element trench.

10. The method as in claim 9, and further comprising:
planarizing a top surface of the ferromagnetic material filling each top element trench with a top surface of the top element mold.

11. The method as in claim 10, and further comprising:
forming a top passivation layer of the top surface of the planarized ferromagnetic material in each top element trench and over the top surface of the top layer mold.

12. The method as in claim 9, and wherein substrate includes an integrated circuit formed thereon and the inductor structure is electrically connected to the integrated circuit.

13. The method as in claim 9, and wherein the seed layer is selected from Ti+Al and Ti+NiFe.

14. The method as in claim 9, and wherein the ferromagnetic material comprises permalloy.

15. The method as in claim 9, and wherein the conductive coil element comprises copper.

* * * * *